United States Patent [19]
Brown

[11] 4,046,961
[45] Sept. 6, 1977

[54] CONDITIONING SYSTEM FOR TRANSDUCER SIGNALS

[75] Inventor: Michael Kenneth Brown, Tecumseh, Mich.

[73] Assignee: Burroughs Corporation, Detroit, Mich.

[21] Appl. No.: 664,012

[22] Filed: Mar. 4, 1976

[51] Int. Cl.² .................... H03G 1/00; G01D 15/18
[52] U.S. Cl. .................................. 179/1 P; 328/167; 328/162; 346/75
[58] Field of Search .............. 179/1 P, 1 VC, 84 VF; 178/DIG. 12; 325/67, 402, 473; 328/165, 167, 162

[56] References Cited
U.S. PATENT DOCUMENTS

| | | | |
|---|---|---|---|
| 2,694,142 | 11/1954 | Laidig | 328/167 |
| 3,535,635 | 10/1970 | Okumura | 179/1 P |
| 3,562,761 | 1/1971 | Stone | 346/75 |
| 3,866,237 | 4/1975 | Meier | 346/75 |
| 3,947,636 | 3/1976 | Edgar | 179/1 P |

OTHER PUBLICATIONS

Texas Instrument Co., *FET Manual*, p. 83, FIG. 413.

*Primary Examiner*—Kathleen H. Claffy
*Assistant Examiner*—E. S. Kemeny
*Attorney, Agent, or Firm*—Robert C. J. Tuttle; Ronald L. Taylor; Carl Fissell, Jr.

[57] ABSTRACT

A signal conditioning system for improving the analog signal-to-noise ratio. The system first filters (to reduce the extrinsic noise outside the bandpass), then squares (to reduce the intrinsic noise inside the bandpass), finally transforms the improved analog signal into a digital-like signal (using a threshold circuit) to interface with associated control logic in an ink jet droplet apparatus.

31 Claims, 8 Drawing Figures

CONDITIONING SYSTEM FOR TRANSDUCER SIGNALS

CROSS REFERENCE TO RELATED PATENTS

A patent application entitled "Phase Correction System" bearing application Ser. No. 636,024, and filed on Nov. 28, 1975 by Michael K. Brown et al. and assigned to Burroughs Corporation describes and claims a system upon which the present invention is a component of.

BACKGROUND OF THE INVENTION

1. Field of the Invention

The invention relates generally to control systems for ink jet droplet apparatuses and more particularly to conditioning circuitry for improving signal to noise ratios of signals inputted to the control system.

2. Prior Art

Previously, signals carried over a line from a transducer for an ink jet droplet apparatus to a receiving control system to be acted thereon would arrive at the system with a relatively low signal to noise ratio making them at times only marginally useful as an indicator of what the transducer had actually sensed. This was due in part to noise encountered at the transducer source, but primarily noise was picked up along the line, particularly if the line environment was relatively noisy.

Attempts to solve this problem have generally taken three approaches. One could upgrade the quality of the transducer and/or line to preempt noise from being induced therein. Alternatively, the frequency selectivity of the receiving control system could be narrowed thereby allowing a lower signal to noise ratio to be used. A final possibility consisted of installing an interfacing circuit between the transducer-line and the receiving control system that would raise the signal to noise ratio thereby allowing even relatively noisy line signals, after being conditioned by the interfacing circuit, to be inputted to a control system having relatively wide frequency selectivity. The first and second approaches to the problem are relatively expensive and thus not entirely desirable.

A particular problem encountered in using the interface circuit approach mentioned supra has been how to generally separate the noise spectrum from the signal spectrum assuming they are mutually exclusive. Additionally and perhaps presenting the most difficulty, comprises the problem of how to reduce or eliminate noise relatively embedded in the signal spectrum when they are not mutually exclusive. Finally, a problem exists in obtaining digital-like signals from a relatively noisy analog-like transducer signal for interfacing with a downstream control system. The final supra mentioned problem being co-existent with the supra embedded noise problem in regards to the methodology of solving the pair of problems.

SUMMARY OF THE INVENTION

Accordingly, it is an important object of the invention to provide a system interfaced between a signal line having a connected transducer and a receiving control logic circuit for improving the signal to noise ratio of the signal line as inputted to the control logic.

It is another object of the present invention to provide, as to the transducer signal, noise elimination within a spectrum extrinsic to a given bandpass, and noise reduction within a spectrum intrinsic to a given bandpass.

A further object of the present invention is to provide circuitry for changing the character of the relatively noisy analog-like transducer signal on the line to that of a digital-like signal.

Another further object of the present invention is to provide a circuit for filtering the transducer signal on the line for eliminating noise outside of the given filtering range.

Yet another object of the present invention is to provide a circuit for squaring the amplitude of the transducer signal on the line for accurately differentiating the signal from the noise embedded in the same frequency range as the signal.

A yet further object of the present invention is to provide a circuit that will output a temporal representative digital-like signal whenever the amplitude squared analog-like transducer signal on the line passes above or below a given threshold point in the circuit.

A yet another further object of the present invention is to provide a frequency sensitive microphone as a transducer.

In the preferred embodiment the conditioning system as described in the above objects comprises a transducer operative to output to an active bandpass filter, the filter in turn may serve a signal to be received by an amplitude squaring circuit, and finally the signal may be acted on by a threshold circuit operative to generate digital-like signals temporally representative of the inputted signal.

BRIEF DESCRIPTION OF THE DRAWINGS

Various other objects, advantages and meritorious features of the invention will become more fully apparent from the following specification, appended claims and accompanying drawing sheets.

The features of a specific embodiment of the invention are illustrated in the drawing, in which.

DETAILED DESCRIPTION OF THE INVENTION

Figure 1:
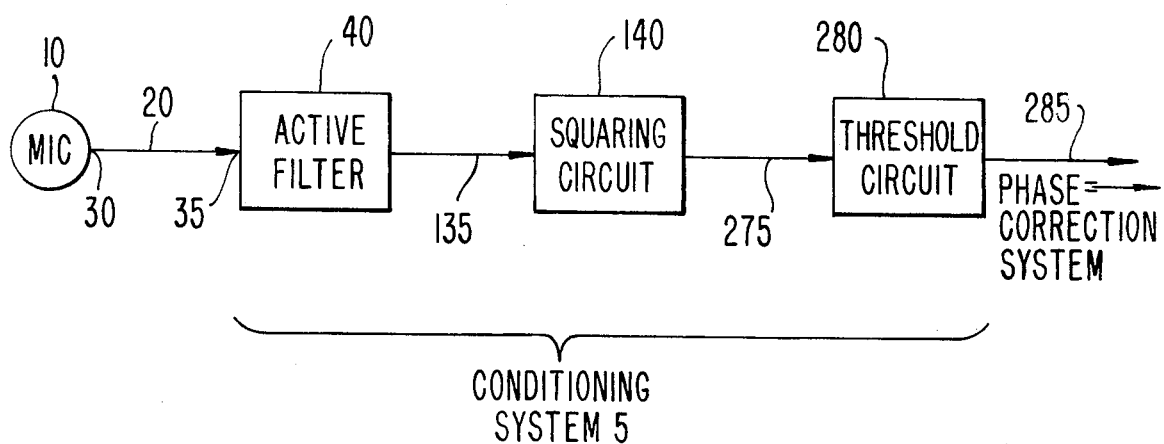
FIG. 1 is a block diagram of the conditioning system for transducer signals.
Figure 3:
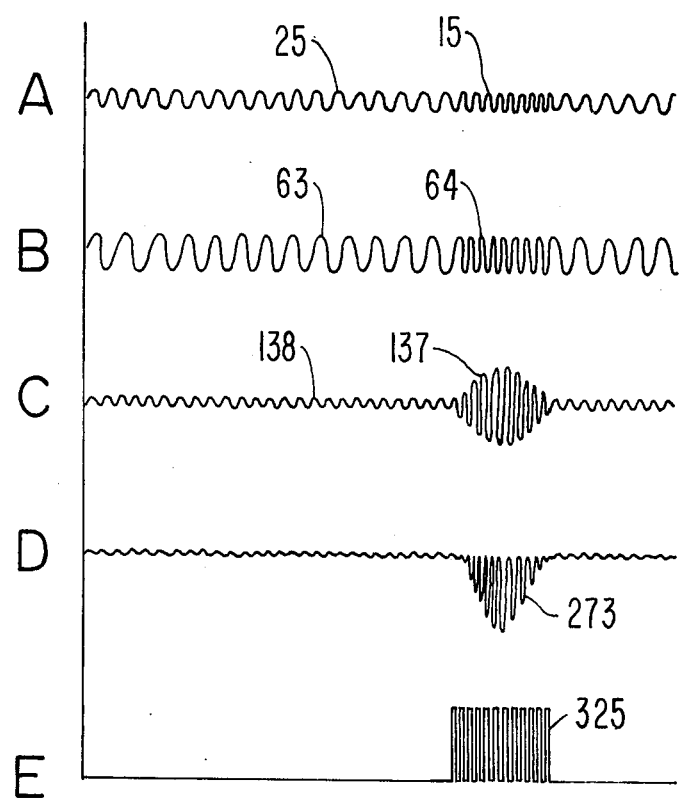
FIG. 3A-E is a waveform diagram of the conditioning system of FIG. 1.
Figure 2A:
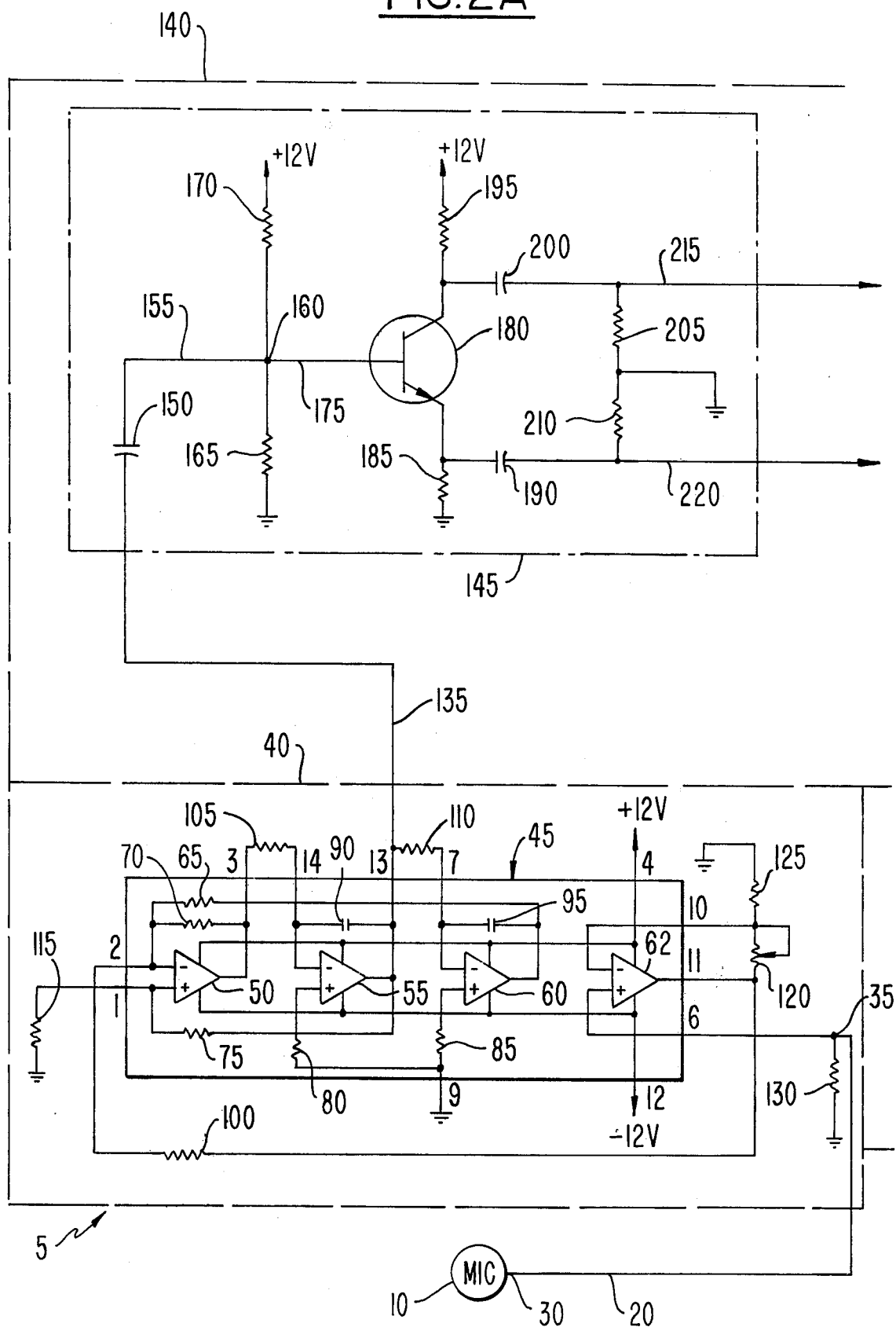
FIG. 2A-B is a schematic diagram of the conditioning system of FIG. 1.
Figure 2B:
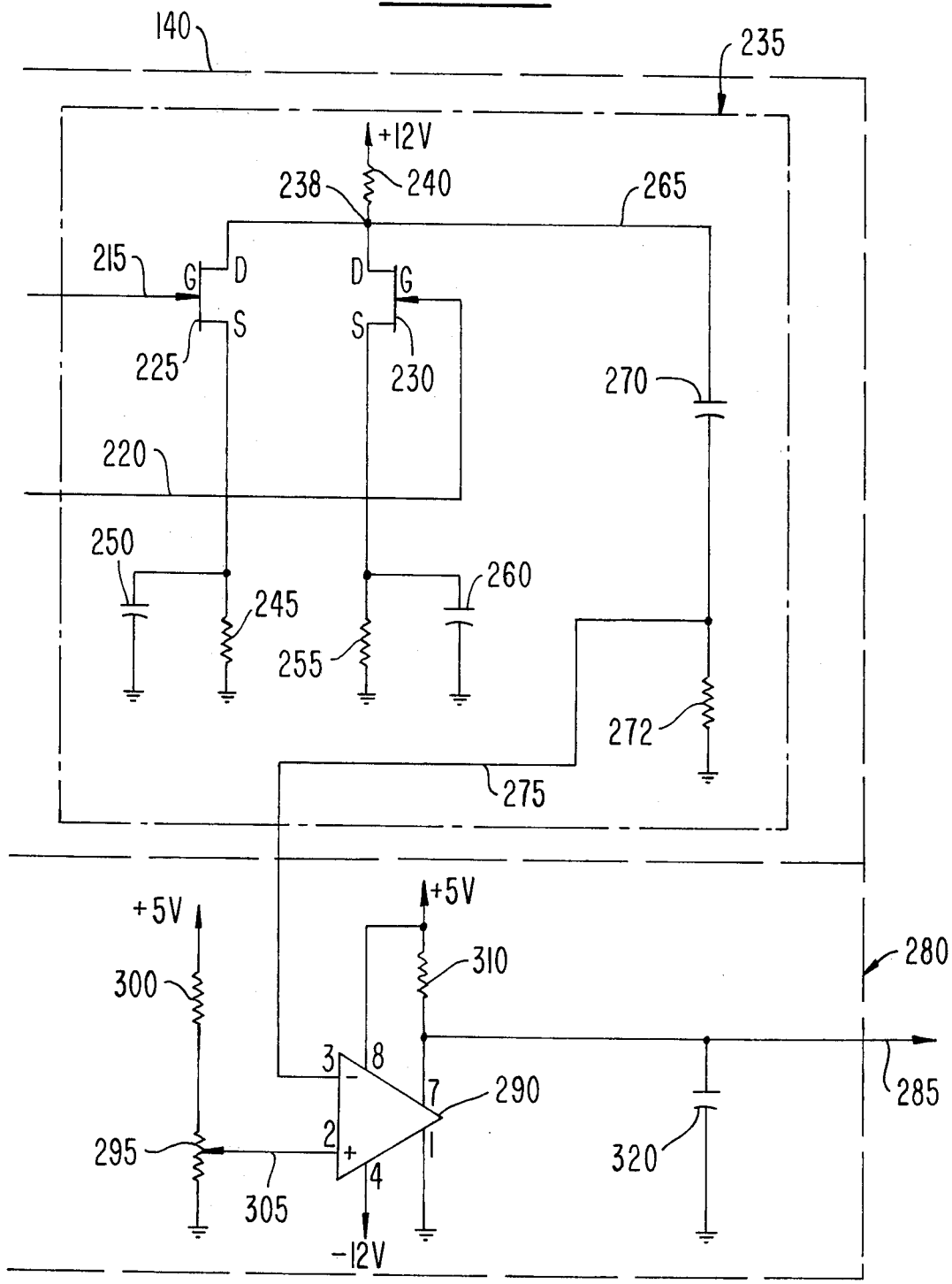

In the preferred embodiment of the invention as shown in FIGS. 1, 2 and 3, and in particular the conditioning system 5 as shown in FIG. 1, a transducer such as a microphone 10 is operative to output analog-like signals 15 on line 20 upon being enabled. In the preferred embodiment, the enabling of the microphone 10 is the result of pulsating ink droplets (not shown) striking the active face of the microphone 10 during a test of an ink jet printer (not shown) as referred to in the supra mentioned application U.S. Ser. No. 636,024 filed on Nov. 28, 1975 by Brown et al. The signal 15 so created will have a center frequency of 8 KC in the preferred embodiment as shown in FIG. 3A. Noise 25 may be induced at the microphone 10 to be carried on the line 20 along with the signal 15. Likewise, even though the line 20 may provide some electromagnetic shielding from a relatively noisy environment, some noise 25 will still radiate into the line 20 to be picked up thereby. As much, the signal to noise ratio may gradually lower as the signal travels from the transmitting end 30 of the line 20 to the receiving end 35 of the line 20 due to the supra induced noise 25. If the environment in which the line 20 resides is relatively noisy and/or the transducer 10 is relatively susceptible to picking up noise 25, the signal to noise ratio of the receiving end 35 of the line 20 may be relatively so low as to preclude all but the most frequency selective pickups by any downstream control logic circuitry such as the supra referenced phase correction system (not shown). The present inventive conditioning system 5 is operatively interposed between the receiving end 35 of the line 20 and the control logic circuitry mentioned supra to eliminate or reduce noise. In the preferred embodiment, the microphone 10 will be most receptive to frequencies centering around 8 KC. The signal outputted at the receiving end 35 of the line 20 will have an amplitude of approximately 100 $MV_{pp}$ and a signal to noise (S/N) ratio of approximately 1.0.

An active bandpass filter 40 as shown in FIGS. 1 and 2 in the system 5 serves to receive signals from end 35 of the line 20. The filter 40 will eliminate all frequencies extrinsic to a given band of frequencies while passing all those intrinsic to the band. The centering or bandpass frequency (fo) is a 7.8 KC or as an approximation 8 KC, the upper and lower bounds of the bandpass being 7.5 and 8.5 KC respectively for a bandwidth (BW) of 1 KC.

In the preferred embodiment, a universal active filter 45, model 881 made by Beckman Corp. as shown in their technical bulletin H74945-274-156P is used as the actual filter component not including the associated parameter circuitry in the active bandpass filter 40. The universal active filter 45 consists of three type 741 operational amplifiers 50, 55 and 60, and their associated R-C passive networks of resistor 65 of 100 KΩ, resistor 70 of 10 KΩ, resistor 75 of 100 KΩ, resistor 80 of 100 KΩ, resistor 85 of 100 KΩ, capacitor 90 of 100 pf and capacitor 95 of 1000 pf. An additional type 741 operational amplifier 62 is used to obtain additional gain so as to amplify the signal 64 and noise 63 to 1 $v_{pp}$ as shown in FIG. 3B. An inverting input at terminal 2 is additionally provided. Operational amplifier 50 is used as a summing amplifier while operational amplifiers 55 and 60 are used as integrators to provide a bandpass output.

The associated parameter circuit in the active bandpass filter 40 for the universal active filter 45 operates to set the bandpass function, the quality factor (Q), and the gain thereof. It is assumed that an inverting input is desired for purposes of the infra calculations. To calculate Q where the fo= 8 KC and the BW = 1 KC, Q = fo/BW ≅ 5.4. To set gain and Q, a resistor 100 is interposed between terminal 11 and the terminal 2 of universal active filter 45. The resistor 100 being equal to $Q \times$ 31.6 KΩ ≅ 162 KΩ. To set fo, resistors 105 and 110 are provided between terminal sets "3 and 14" and "13 and 7" respectively of the universal active filter 45, each having a value of (5.04 × $10^7$/fo) ≅ 6.2 KΩ. An additional component for setting gain and Q is resistor 115 interposably connecting terminal 1 of the universal active filter 45 to ground and having a value of (100 K/3.45 × Q) ≅ 7.15 KΩ. Terminals 4 and 12 of the universal active filter 45 are connected to a +12 V. and −12 V. supply voltage respectively. Interposed between terminals 10 and 11 of the universal active filter 45 is an adjustable resistor 120 of 20 KΩ and a grounded resistor 125 of 1 KΩ connected to terminal 10 for adjusting the feedback on the operational amplifier 62 to give additional gain. A grounded resistor 130 of 10 KΩ is connected at its other end to terminal 6 of the universal active filter 45 to set the bias for the positive input of the operational amplifier 62. Terminal 6 of the universal active filter 45 also serves as the connection for the receiving end 35 of line 20 and thus is the input for universal active filter 45. The output for the universal active filter is off terminal 13 on line 135. By removing the frequencies that are extrinsic to the given bandpass, an improved S/N of approximately 5 to 10 may be achieved as shown for the signal 137 and noise 138 in FIG. 3C.

In order to achieve a further improved S/N, particularly in regards to frequencies intrinsic to the given bandpass, a FET amplifier squaring circuit 140 is utilized as shown in FIGS. 1 and 2. In the preferred embodiment, an FET squaring circuit is used that is similar to that used in the Texas Instrument FET manual as shown in FIG. 413 on page 83.

The circuit 140 is operative to receive a signal input on line 135 which in turn is fed to the phase divider circuit 145. The phase divider circuit 145 acts to drive the inputs of the squaring FET's 225 and 230 out of phase. In the phase divide circuit 145, line 135 connects to a capacitor 150 of 2.2 uf operative to allow passage of sinusoidal-like signals only. The capacitor 150 in turn outputs on line 155 to a terminal 160 serving as a terminus for a voltage divider biasing network. This network comprises a grounded resistor 165 of 47 KΩ at one end of terminal 160 and a biased resistor of 47Ω having a +12 V. supply applied thereto. Signals emanating from terminal 160 are fed on line 175 to the base of transistor 180. The emitter of transistor 180 is bifurcated to a grounded biasing resistor 185 of 1 KΩ and a phasing capacitor 190 of 0.1 uf. The collector of transistor 180 is bifurcated to a biasing resistor 195 of 1KΩ having a +12 V. supply applied thereto and a phasing capacitor 200 of 0.1 uf. Grounded phasing resistors 205 and 210 of 1 MΩ are connected to the opposite ends of phasing capacitors 200 and 190 respectively. Each of the phasing resistor-capacitor networks of "200 and 205" and "190 and 210" as outputted in lines 215 and 220 respectively act as out of phase signals as to each other.

The phase divider circuit 145 acts to output its pair of out of phase signals on lines 215 and 220 to the input gates (G) of a pair of field effect transistors (FET) 225 and 230 respectively and their associated circuitry hereinafter known as the FET subcircuit 235. The drains (D) of the FET's 225 and 230 are tied together at terminal 238 to one end of a load resistor 240 of 1.6 KΩ having a +12 V. supply at its other end. Each of the sources (S) of the FET's 225 and 230 are tied to separate grounded bypass RC networks of resistor 245 of 1 KΩ and capacitor 250 of 100 uf, and resistor 255 of 1 KΩ and capacitor 260 of 100 uf respectively. At the terminal 238, a line 265 connects to capacitor 270 of 0.1 uf and grounded resistor 272 of 100 KΩ operative to allow passage only of sinusoidal signals from the FET squaring circuit's 140 output. The output signal 273 as shown in FIG. 3D from capacitor 270 proceeds on line 275 to the thresholding circuit 280 described infra.

The philosophical grounds for the FET squaring circuit 140 is that of a device that will relatively reduce the noise intrinsic to a given signal band of frequencies by improving the S/N ratio. Particularly the FET circuit 140 when biased appropriately will have a parabolic transfer function which can be used to perform an amplifier squaring function. That is, $V_{out} = K V.2/\text{in}$ where K is a gain constant. For phase correction purposes, as cross referenced in the supra application, the actual signal is unimportant as opposed to the signal location in a given time frame. As such, the signal may be squared and thus amplitudably distorted without affecting the informational content lodged in the temporal position of the signal. Specifically, since the average peak amplitude is characteristically higher than the surrounding noise, the difference in voltage levels between the signal plus noise portion and the pure noise portion can be relatively increased by squaring the signal function, thus improving the chances of separation in the infra threshold circuit 280 as will be seen.

Mathematical analysis of the FET squaring circuit 140 starts with the square-law approximation to the pinch-off drain current as shown below:

$$i_D = i_{D_{SS}}\left(\frac{V_g}{V_p} - 1\right)^2 = i_{D_{SS}}\left(\frac{V_g^2}{V_p^2} - \frac{2V_s}{V_p} + 1\right)$$

where
$i_D$ = drain current
$i_{DSS}$ = drain current with gate to source short circuited
$V_g$ = gate voltage
$V_p$ = pinch off voltage Because the two FET's 225 and 230 here had their drains (D) tied together and their gate (G) inputs fed out of phase as mentioned supra, the first order terms will tend to cancel in the load resistor 240. As such, the infra equations are obtained:

$$i_{D_1} = i_{D_{SS_1}}\left(\frac{V_{g1}^2}{V_{p1}^2} - \frac{2V_{g1}}{V_{p1}} + 1\right) \quad (A)$$

$$i_{D_2} = i_{D_{SS_1}}\left(\frac{V_{g2}^2}{V_{p2}^2} - \frac{2V_{g2}}{V_{p2}} + 1\right) \quad (B)$$

$$i_{D_2} = i_{D_{SS}}\left(\frac{-V_{g1}^2}{V_{p2}} + \frac{2V_{g1}}{V_p} + 1\right) \quad (C)$$

where $i_{D_{SS_1}} = i_{D_{SS_2}} + i_{D_{SS}}$ $V_{p1} = V_{p2} = V_p$ $V_{g2} = -V_{g1}$ Summing supra equations A and C where $i_{D1}$ plus $i_{D2}$ can be algebraically summed in the load resistor 240:

$$i_{D1} + i_{D2} = i_{D_{SS}}\left(\frac{2V_g^2}{V_p^2} + 2\right)$$

The DC voltage term may then be eliminated by RC coupling of resistor 272 and capacitor 270 thus leaving:

$$V_{out} = R_L(i_{D1} + i_{D2}) = 2R_L i_{DSS}\left(\frac{V_g^2}{V_p^2}\right)$$

or $V_{out} = K\, V_{in}2$ where
$K = 2\, RL\, i_{D_{SS}}/V2p$
$V_{in} = V_g$
$R_L$ = Load Resistor 240
$V_{out}$ = Signal 273 on line 275

As a result, as shown in FIG. 3D, the signal 273 outputted on line 275 has a S/N ratio of approximately 20-25 and an output voltage of approximately 2 V.

It will be further noted that the transfer characteristic curves (not shown) of the two FET's 225 and 230 will normally cross at a common quiescent point. The sum of the two will form a correct parabola with the lowest level of the curve being twice the value of the bias level of either FET 225 or 230. If the resultant parabolic transfer function representing the output of circuit 140 is sinusoidal, then it will be realized that the output is proportional to $SIN^2\theta$. Thus if $SIN^2\theta = (1 - Cos2\theta)/2$ then the output signal 273 on line 275 will be twice the frequency (16 KC) as the input signal 137 (8 KC) on line 135.

The thresholding circuit 280 mentioned supra acts to receive the analog-like signals 273 on line 275 from the FET squaring circuit 140 and process them to be outputted as digital-like signals 325 on line 285 to the phase correction system described in the cross referenced application supra. More particularly, the squared signals from the supra FET squaring circuit 140 are relatively easily detected by the threshold circuit 280 as being outside a threshold level on the other side of which contains most of the embedded noise intrinsic to the bandpass, thus giving an improved S/N ratio combinably using the two circuits 140 and 280. The circuit 280 comprises a nonlinear operational amplifier 290 where a type 311 is the preferred model. Line 275 is operative to send signals to the terminal 3 negative input of the amplifier 290. Additionally, there is a voltage divider network comprising an adjustable resistor 295 having 100Ω which is grounded at one end and connected at its other end by a dropping resistor 300 having 560Ω biased by a +5 V. supply. The arm of the adjustable resistor 295 is connected through a line 305 to the terminal 2 positive reference input of the amplifier 290. The amplifier 290 itself is biased at terminal 8 to a +5 V. supply and at terminal 4 to a −12 V. supply. The terminal 1 output of the amplifier 290 is grounded while the terminal 8 is connected through a dropping resistor 310 having 1 KΩ to the supra mentioned +5 V. supply. The terminal 7 output of the amplifier 290 also serves to output signals on line 315 to a grounded capacitor 320 of 0.01 uf serving as an additional noise trap. The signal 325 then proceeds on the supra mentioned line 285 which is the output line of the threshold circuit 280.

In the operation of the threshold circuit 280, all signals from the FET squaring circuit 140 as applied at terminal 3 of the amplifier 290 that drop below the reference voltage of −0.25 V. at terminal 2 of the amplifier 140 will cause a uniform digital-like signal 325 of +5 V. to be outputted each time therefrom as shown in FIG. 3E with the result that a S/N ratio of → ∞ may be achieved.

It will be further noted that in the preferred embodiment of the present invention using the concepts of the phase correction system of the cross reference application, that due to the relatively narrow bandwidth of the microphone 10 as selected, only part of a pair of adjacent phase signal groupings may be represented in the outputted signal 325. Particularly on an average basis, only 16 out of a possible twenty signals (ten for each phase grouping) will be represented in the composite signal 325 which may have a bandwidth of approximtely 3 ms. The composite output signal 325 may be measured as one test signal for the supra mentioned phase correction system.

While the above referenced embodiments of the invention have been described in detail, it will be appreciated that other modifications and variations therein may be made by those skilled in the art without departing from the true spirit and scope of the invention.

What is claimed is:

1. An interface apparatus interposed on a line connecting a transducer to its associated control logic for improving the signal to noise ratio thereof comprising extrinsic means operative to receive signals from the transducer for relatively excluding all frequencies not within a given band, and intrinsic means connected to said extrinsic means for amplifiably squaring signals therefrom and for generating digital-like representations of the squared signals that exceed a given threshold level.

2. An interface unit for improving signal to noise ratios comprising transducer means for sensing changes from a given ambient level, means operative to receive signals from said transducer means for excluding relatively all frequencies extrinsic to a given band, and means connected to said extrinsic frequency exclusion means for amplifiably squaring signals therefrom and for transforming the squared signals into digital-like representations thereof whenever a given threshold level is exceeded.

3. A conditioning module interposed on a line connecting a transducer to its associated control logic for improving the signal to noise ratio thereof comprising active filter means operative to obtain signals from the transducer for amplifiably excluding all frequencies not within a given bandpass, means connected to said active filter means for geometrically squaring the amplitude of the signal from said active filter means, and means receiving signals from said amplitude squaring means for generating digital-like representations of the squared signal whenever a given threshold level is exceeded.

4. A conditioning system for improving signal to noise ratios comprising transducer means for sensing changes from a given ambient level in an observed environment, active filter means operative to receive signals from said transducer for amplifying and for relatively excluding all frequencies extrinsic to a given bandpass, means connected to said active filter means for amplitudably squaring the signal therefrom, and means receiving signals from said amplitude squaring means for generating digital-like representations of the squared signal when a given threshold level is exceeded.

5. The conditioning system according to claim 4 wherein said transducer means is a microphone.

6. The conditioning system according to claim 4 wherein said active filter means is an active bandpass filter.

7. The conditioning system according to claim 4 wherein said active filter means further includes a linear amplifier for amplifying inputted signals.

8. The conditioning system according to claim 7 wherein said linear amplifier is an operational amplifier.

9. The conditioning system according to claim 4 wherein said amplitude squaring means comprises phase divider means receiving an input from said active filter means for providing a pair of out-of-phase signals and paired squaring means operative to input the pair of out-of-phase signals from said phase divider means for allowing individually the transfer characteristics of each of said paired squaring means to intersect at a common quiescent point, and for parabolically summing the individual transfer characteristics to give a composite signal that has a frequency component and a summed amplitude value twice that of the frequency and the level of the common quiescent point of the individual transfer curves respectively.

10. The conditioning system according to claim 9 wherein said phase divider means comprises a first capacitor for receiving a signal from said active filter means.

11. The conditioning system according to claim 10 wherein said phase divider means further comprises a voltage divider network coupled to receive a signal from said first capacitor including a terminally connected first grounded resistor and a first positive biased resistor.

12. The conditioning system according to claim 11 wherein said phase divider means further comprises a transistor having a base, collector and emitter terminals, said base terminal operatively coupled to receive signals from said voltage divider network.

13. The conditioning system according to claim 12 wherein said phase divider means further comprises a second positive biased resistor operatively coupled to the collector of said transistor.

14. The conditioning system according to claim 13 wherein said phase divider means further comprises a second grounded resistor coupled to the emitter of said transistor.

15. The conditioning system according to claim 14 wherein said phase divider means further comprises a second and third capacitor coupled to the collector and emitter of said transistor respectively.

16. The conditioning system according to claim 15 wherein said phase divider means further comprises a third and fourth grounded resistor connected to receive signals from said second and third capacitors respectively.

17. The conditioning system according to claim 16 wherein said phase divider means further comprises a pair of lines coupled to receive signals from said second and third capacitors for providing conductors for the out-of-phase signals outputted thereby respectively.

18. The conditioning system according to claim 9 wherein said paired squaring means comprises a pair of FET transistors having drain, gate, and source terminals operative to receive out-of-phase signals from said phase divider means to each of the respective gate terminals of said pair of FET transistors.

19. The conditioning system according to claim 9 wherein said paired squaring means further comprises a first and second grounded parallel resistor-capacitor combination to each of the respective source terminals of said pair of FET transistors.

20. The conditioning system according to claim 9 wherein said paired squaring means further comprises a third positive biased resistor commonly coupled to each of the respective drain terminals of said pair of FET transistors.

21. The conditioning system according to claim 20 wherein said paired squaring means further comprises a fourth capacitor commonly coupled to each of the respective drain terminals of said pair of FET transistors.

22. The conditioning system according to claim 21 wherein said paired squaring means further comprises a fifth grounded resistor operatively coupled to receive signals from said fourth capacitor.

23. The conditioning system according to claim 22 wherein said paired squaring means further comprises a line coupled to receive signals from said fifth grounded resistor for providing a conductor for the amplitude squared signal outputted thereby.

24. The conditioning system according to claim 4 wherein said digital-like generating means comprises an operational amplifier having a signal input and a reference input operative to receive signals from said amplitude squaring means at its signal input.

25. The conditioning system according to claim 24 wherein said digital-like generating means further comprises a voltage divider network coupled to output to the reference input of said operational amplifier, said voltage divider network including an adjustable resistor that is grounded at one end having an arm acting as an output lead and a fourth positive biased resistor coupled to the opposite end of said adjustable resistor.

26. The conditioning system according to claim 25 wherein said digital-like generating means further comprises positive and negative bias sources for said operational amplifier.

27. The conditioning system according to claim 26 wherein said digital-like generating means further comprises a pair of output terminals for said operational amplifier, said first output terminal being grounded, and a fifth positive biased resistor being coupled to said second output terminal.

28. The conditioning system according to claim 27 wherein said digital-like generating means further comprises a grounded capacitor coupled to receive a signal from the second output of said operational amplifier.

29. The conditioning system according to claim 28 wherein said digital-like generating means further comprises a line coupled to receive signals from said grounded capacitor for providing a conductor for the digital-like signal outputted thereby.

30. A method for improving the signal to noise ratio between a transducer and its associated control logic, said method comprising the steps of amplifying the transducer signal, filtering out all frequencies extrinsic to a given bandpass, squaring the amplitude of the filter signal, and generating digital-like representations of the squared signal whenever a given threshold level is exceeded.

31. In an ink jet printing system of the class having a phase correction system for correcting the time-phase relation between droplet formation and droplet charging, where the phase correction system is of the type incorporating a transducer responsive to the impact of ink droplets to output an analog signal representative thereof, a conditioning system for improving the signal-to-noise ratio of the transducer output comprising:
bandpass means, receiving as input the analog signal for passing only a selected frequency band of the analog signal and effectively filtering out frequencies extrinsic to the selected frequency band;
squaring means, receiving as input the selected frequency band of the analog signal, for squaring the amplitude of said selected frequency band; and
trigger means receiving as a first input the output of the squaring meansand as a second input a reference signal for outputting a pulse whenever the first input exceeds in value the second input, thereby improving the signal-to-noise ratio of the analog transducer signal.

* * * * *